United States Patent [19]

Rapp

[11] 4,379,006

[45] Apr. 5, 1983

[54] $B_2O_3$ DIFFUSION PROCESSES

[75] Inventor: James E. Rapp, Oregon, Ohio

[73] Assignee: Owens-Illinois, Inc., Toledo, Ohio

[21] Appl. No.: 291,139

[22] Filed: Aug. 7, 1981

[51] Int. Cl.³ .......................................... H01L 21/223
[52] U.S. Cl. ..................................... 148/189; 148/186
[58] Field of Search ............... 148/186, 187, 188, 189, 148/190, 191; 252/950, 951

[56] References Cited

U.S. PATENT DOCUMENTS

| | | | |
|---|---|---|---|
| 3,007,816 | 11/1961 | McNamara | 148/191 X |
| 3,653,862 | 4/1972 | Lynch | 428/427 X |
| 3,907,618 | 9/1975 | Rapp | 148/189 |
| 3,928,096 | 12/1975 | Vergano et al. | 148/189 |
| 3,961,969 | 6/1976 | Rapp | 148/189 X |
| 3,962,000 | 6/1976 | Rapp | 148/189 |
| 3,998,667 | 12/1976 | Rapp | 252/951 X |
| 4,028,151 | 6/1977 | Lindmayer | 148/189 |
| 4,160,672 | 7/1979 | Rapp | 148/189 X |

*Primary Examiner*—G. Ozaki
*Attorney, Agent, or Firm*—Charles S. Lynch; Myron E. Click; David H. Wilson

[57] ABSTRACT

Disclosed is a method of evolving $B_2O_3$ from certain $B_2O_3$ containing glass-ceramics by heating the glass-ceramic in the pressure of helium as a carrier or transport gas.

4 Claims, No Drawings

$B_2O_3$ DIFFUSION PROCESSES

This invention relates to a method for increasing the rate of evolution of boron from certain $B_2O_3$ containing glass-ceramics which are useful as glass-ceramic dopant hosts for a source of boron. These dopant hosts are particularly useful for "doping" semiconductor materials with boron.

My particular glass-ceramic dopant hosts are disclosed in my U.S. Pat. Nos. 3,998,667 and 3,961,969.

In those patents the processes particularly described for vapor phase transport of $B_2O_3$ from the dopant host are useful in the well-known isolation processes of doping semiconductors. In my prior patents I described the use of the inert transport or carrier gases nitrogen and argon. These gases and the processes described therein are notably successful for the isolation processes of doping semiconductors.

However, in many processes such as in base area diffusion depositions and in depositions of $B_2O_3$ for metal-oxide semiconductor devices, improvement is desired in the rate of evolution of $B_2O_3$ from my planar dopants; a high rate of evolution is desired and especially at lower temperatures. The object is twofold; first, in most of the latter processes a heavier film is desired and second, a lower temperature or a higher rate of evolution is needed in order to minimize surface defects in the semiconductors such as silicon. Thus, semiconductors such as silicon normally have flaws or dislocation in their surfaces. High temperature treatment tends to cause such dislocations to propagate. Minimization of time at the high temperature or lowering of the temperature of treatment assists greatly in eliminating or minimizing such surface defects. Of course, the dislocations are also present in the silicon semiconductors which are doped by high temperature isolation processes. Usually, however, the surface which is doped by a high temperature isolation process is simply not as sensitive to such flaws. Even so, minimization of flaws in semiconductors prepared at such high temperatures is also desirable, and the present invention accomplishes this by minimizing the time needed at the high temperature to achieve a given amount of boron deposition.

In accordance with the present invention, I have discovered a new method of promoting release of the boron-containing species from my glass-ceramic dopant hosts to the vapor phase, and the vapor phase transport thereof, wherein the rate of release or evolvement from the dopant host is greatly increased for a given temperature by using helium as a carrier gas. When using my process to dope semiconductors, the invention results in a heavier deposition of boron on the semiconductor in a given time and consequently permits a shorter deposition time and/or a lower range of temperatures to be employed for the vapor phase transport of the boron values, because of the use of helium as a carrier gas. While $B_2O_3$ evolution temperatures generally are in the range from 700° to 1200° C., the invention finds its most usual application using temperatures of 700° to 1050° C. and especially at temperatures below 950° C.

The method of the invention is especially applicable to glass-ceramic dopant hosts containing boron, which are made by the thermal in situ crystallization of a thermally crystallizable glass which consists essentially of the components and amounts as set forth in Tables A, B and C, which glass is also substantially free of alkali metal oxides, PbO, $SnO_2$ and CuO.

TABLE A

| Component | Mole Percent |
|---|---|
| $SiO_2$ | 15–60 |
| $Al_2O_3$ | 10–30 |
| $B_2O_3$ | 20–60 |
| RO | 3–25 |
| BaO | 0–15 | wherein $Al_2O_3/RO = 1.5-4$,
wherein RO is selected from BaO, MgO, CaO, SrO and mixtures thereof; and
when $SiO_2$ is over 40, $B_2O_3$ is not over 40, RO is not over 20, and BaO is at least 1;
when $SiO_2$ is not over 40, $Al_2O_3$ is at least 15, RO is at least 5, MgO is not over 15, CaO is not over 10, SrO is not over 10, BaO is not over 15, $La_2O_3$ is 0–5, $Nb_2O_3$ is 0–5 and $Ta_2O_3$ is 0–5.

TABLE B

| Component | | Mole Percent |
|---|---|---|
| $SiO_2$ | over | 40 to 60 |
| $Al_2O_3$ | | 10 to 30 |
| $B_2O_3$ | | 20 to 40 |
| BaO | | 1 to 15 |
| Alkaline earth oxides selected from the group consisting of BaO, MgO, CaO, SrO, and mixtures thereof | | 3 to 20 |

Wherein $\dfrac{Al_2O_3}{\text{Alkaline earth oxides}} = 1.5-4$

TABLE C

| Component | Mole Percent |
|---|---|
| $SiO_2$ | 15–40 |
| $Al_2O_3$ | 15–30 |
| $B_2O_3$ | 20–60 |
| RO | 5–25 |
| $La_2O_3$ | 0–5 |
| $Nb_2O_3$ | 0–5 |
| $Ta_2O_3$ | 0–5 | wherein $\dfrac{Al_2O_3}{RO} = 1.5-4$ wherein RO is

| | |
|---|---|
| MgO | 0–15 |
| CaO | 0–10 |
| SrO | 0–10 |
| BaO | 0–15 |

The following comments apply to the compositions set forth in the foregoing Tables A, B and C:

The presence of $La_2O_3$, $Nb_2O_5$, and $Ta_2O_5$ contribute to the melting and formation of parent glass compositions having high proportions (e.g., greater than about 50 mole percent) $B_2O_3$ which are resistant to uncontrolled devitrification.

In addition to the above oxides, the term "consisting essentially of" is intended to include minor proportions (i.e., up to about 10 mole percent) of components other than alkali metal oxides, PbO, $SnO_2$ and CuO, such as glass forming oxides, modifying oxides, nucleant oxides (e.g., $TiO_2$ and/or $ZrO_2$) and refining aids, when such ingredients are not detrimental to the semiconductor doping and are required to achieve specific chemical or physical properties.

The compositions of Table B and how to prepare them are described in detail in my U.S. Pat. No. 3,998,667, the disclosures of which are incorporated herein by reference. The compositions set forth in Table C and how to make them are described in detail in my U.S. Pat. No. 3,961,969, the disclosures of which are incorporated herein by reference.

In an important aspect of the invention I provide an improvement in a process for doping a semiconductor wherein a semiconductor and a glass-ceramic dopant host for vapor phase transport of $B_2O_3$ are maintained in vapor phase communication in the presence of a carrier gas phase at a temperature and for a time sufficient to effect transport and deposit of $B_2O_3$ on said semiconductor, and wherein the glass-ceramic dopant host consists essentially of the components and amounts set forth in Table A, the improvement comprising employing helium as a carrier gas for transporting $B_2O_3$ evolved from the surface. The carrier gas phase should be essentially free of water. The carrier gas phase is preferably entirely helium, but it can be 60-100 volume percent helium, with the other gases being inert gases such as nitrogen or argon.

The invention is described in terms of the "vapor phase transport of $B_2O_3$" for lack of a clear understanding of the boron-containing species vaporized from the glass-ceramic host. Accordingly, this term includes whatever boron-containing species is responsible for the transport effect. Similarly, the diffusion process is discussed in terms of "boron diffusion" or "boron deposition" into, or onto, the semiconductor for lack of a clear understanding of the boron-containing species actually being diffused. Accordingly, this term includes whatever boron-containing species is transported or is responsible for the diffusion doping effect.

Boron is deposited from the vapor phase onto the surface of a semiconductor and diffuses to a controlled depth within the silicon wafer. The concentration and depth of the junction is proportional to the time and temperature of the doping and diffusing process. Of course, in some processes the deposition and diffusion steps are done simultaneously in the same apparatus at a single temperature, while in other processes the fabricator of the semiconductor device prefers to effect the deposition in one apparatus and to complete the diffusion in a separate apparatus, usually at a different, usually higher, temperature.

The improved process of the present invention for release of boron containing vapors from the glass-ceramic hosts is especially useful in processes for vapor phase transport of $B_2O_3$ and doping of a semiconductor with boron. However, my process is useful for evolving $B_2O_3$ from the glass-ceramic dopant host for any purpose. For instance, a compressive surface can be deposited on the glass-ceramic bodies disclosed in U.S. Pat. No. 3,653,862, using evolution temperatures as noted herein, especially temperatures between 1000° and 1200° C. in the presence of helium as the transport gas, wherein the vapors are allowed to contact the glass-ceramic of said patent while said glass-ceramic is at a temperature of from about 400° to about 800° C., resulting in deposition of $B_2O_3$ on the surface. Thereafter, the glass is heat treated as set forth in Example 1 of said patent. The heat treatment results in the crystallization to a glass-ceramic with a concomitant formation of a glassy borosilicate glaze layer under compressive stress on the surface.

Glass-ceramic compositions A and B, which were formed into dopant hosts, are as follows:

| Component | Glass - Ceramic A Weight Percent | Glass - Ceramic B Weight Percent |
|---|---|---|
| $SiO_2$ | 28.2 | 33.7 |
| $Al_2O_3$ | 20.6 | 26.1 |
| $B_2O_3$ | 41.2 | 28.7 |
| MgO | 1.5 | 2.0 |
| BaO | 8.5 | 9.5 |

Glass-ceramic A was made as described in U.S. Pat. No. 3,961,969; see especially Example 1. However, the wafers cut in this case were three inches in diameter.

Glass-ceramic B was made as described in U.S. Pat. No. 3,998,667, but, again, the wafers made were three inches in diameter.

In obtaining the results recorded in Tables 1, 2 and 3, three inch wafers were placed in a boat as shown in FIG. 3 of U.S. Pat. No. 3,961,969, except that only one wafer was employed next to a single three-inch silicon wafer. The boat was placed in a tubular furnace 101 millimeters in diameter. Through the furnace the carrier gas was flowed at a rate of one liter per minute and the temperature during the tests was maintained at the temperature indicated in the respective tables. In Tables 1, 2 and 3 are recorded the times of treatment and the weight loss using the gases noted. The weight loss, of course, is an indication of the rate of loss of boron or $B_2O_3$ from the glass-ceramic wafers. Glass-ceramic B was used in the tests carried as reported in Table 1, and glass-ceramic A was used in the tests as reported in Tables 2 and 3.

TABLE 1

| Hours at | Weight Loss, $Mg/cm^2$ | |
|---|---|---|
| 1050° C. | $N_2$ | He |
| 2 | 0.043 | |
| 3 | | |
| 15.5 | | 0.210 |
| 17.5 | 0.148 | |
| 18.5 | | |
| 20.5 | 0.182 | 0.266 |
| 36 | 0.261 | |
| 36.5 | | 0.375 |
| 40.5 | | 0.478 |
| 41.5 | 0.297 | |
| 58.5 | | 0.563 |
| 59 | 0.362 | |
| 126 | 0.599 | |
| 126.5 | | 0.843 |
| 131.5 | | |
| 137.5 | | |
| 148.5 | 0.671 | |
| 153 | | |
| 157 | | 0.957 |
| 185 | 0.786 | |

TABLE 2

| Hours at | Weight Loss, $Mg/cm^2$ | | |
|---|---|---|---|
| 900° C. | $N_2$ | Ar | He |
| 4.5 | | 0.017 | |
| 5 | | | 0.036 |
| 15.5 | 0.053 | | |
| 20 | | 0.049 | |
| 20.5 | | | 0.104 |
| 43 | | 0.094 | |
| 43.5 | 0.119 | | 0.191 |
| 60.5 | 0.146 | | |
| 61.5 | | | 0.277 |
| 65 | | 0.142 | |
| 67.5 | 0.165 | | |

TABLE 2-continued

| Hours at | Weight Loss, Mg/cm$^2$ | | |
|---|---|---|---|
| 900° C. | N$_2$ | Ar | He |
| 106.5 | 0.235 | | |
| 131 | | | 0.503 |
| 154 | | | 0.583 |

TABLE 3

| Hours at | Weight Loss, Mg/cm$^2$ | |
|---|---|---|
| 850° C. | N$_2$ | He |
| 3 | | 0.020 |
| 21.5 | | 0.049 |
| 24.5 | | 0.062 |
| 83.5 | 0.108 | |
| 90 | | 0.145 |
| 107 | 0.131 | |
| 122 | | 0.193 |
| 124 | 0.138 | |
| 137 | | 0.243 |
| 194 | 0.194 | |
| 203 | | 0.306 |
| 356.5 | 0.305 | |

It will be seen from the data reported in Tables 1, 2 and 3 that the rate of evolution of boron from the wafers is much greater with helium than with either nitrogen or argon. Examination of Table 2 will show that the rate of evolution using nitrogen and argon are roughly the same, but that helium causes a rate of evolution approximately double that of the other gases.

This is an extremely surprising result since theory predicts that the rate of evolution would be essentially the same for any inert gas. See Thermal Dynamics of Solids, by Richard A. Swalin, John Wiley and Sons, New York, June 1967, pages 80-81. Nevertheless, even though the same rate of flow of one liter per minute was used in all of the tests, helium surprisingly resulted in the much higher evolution.

In tests of evolution of B$_2$O$_3$ and deposition and doping on silicon wafers, a setup as shown in FIG. 3 of U.S. Pat. No. 3,961,969 was used, except that the boat had three-inch silicon semiconductor wafers in 15 positions and three inch glass-ceramic wafers of Composition B in the positions alternating between the silicon wafers. Again, the boats were placed in a 101 millimeter inside diameter tubular furnace and, with the exceptions noted, the following treatment cycle was used for the runs reported in Table 4 that employed essentially dry helium as the carrier gas. The steps were as follows:
 a. Insert wafers with N$_2$=2 l/min at 750° C.
 b. Hold until the furnace and boat has come to thermal equilibrium (approx. 5 min.)
 c. Heat furnace to 850° C. (approx. 10 min.)
 d. Change gas from N$_2$=2 l/min to He=1 l/min.
 e. Hold for 1 hour with He 1 l/min.
 g. Change gas from He=1 l/min to N$_2$=2 l/min. and cool furnace to 750° C. (approx. 20 min.) and hold for 5-10 minutes before removal.

The steps were the same when using nitrogen in step (e) or using argon in step (e), except that in the case of nitrogen, N$_2$ was used throughout, of course. Nitrogen was used in the various steps where the carrier gas was helium in step (e), only because of the desire to save helium.

In some instances in the work reported in Table 4 when an additional step (f) was inserted after step (e), step (f) is to change the gas to oxygen at the rate of one liter per minute for an additional one-half hour at 850° C. This step significantly increases the sheet resistivity of the silicon wafers. The uniformity of sheet resistivity from this added step tends to depend on the uniformity and thickness of the glassy film previously deposited during step (e).

In run No. 8 in Table 4 the above schedule was departed from in that step (e) was carried out at 825° C. for a period of 1.5 hours.

Turning now to Table 4 it will be noted that in most instances the measurements were made on the doped silicons in positions 2, 5, 8, 11 and 14 in the boats. Before the sheet resistivity was run, the surface of the silicon was etched with dilute hydrofluoric acid to remove the glassy film that forms. The hydrofluoric acid does not affect anything except the oxidized film. Several measurements of resistivity were made on each silicon wafer and the standard deviation determined. The average resistivity results for all of the wafers in a particular boat are reported at the end.

It will be noted that the thickness of the film in angstrom units was estimated in the standard way from the color of the film on the silicon wafers.

TABLE 4

| | Sheet Resistivity, ($\Omega/\square$)/Std Deviation, Percent | | | | | | | |
|---|---|---|---|---|---|---|---|---|
| | Run 1 | 2 | 3 | 4 | 5 | 6 | 7 | 8 |
| Location of Diffusion Source | | | | | | | | |
| 1 | | | | | | | | |
| 2 | 169/2.5 | 273/2.9 | 173/4.3 | 286/1.5 | 153/3.4 | 147/1.5 | 288/1.5 | 225/3.3 |
| 3 | | | | | | | | |
| 4 | | | | | | | | |
| 5 | 162/2.2 | 256/3.1 | 169/9.7 | 244/4.4 | 150/2.7 | — | 289/3.4 | — |
| 6 | | | | | | | | |
| 7 | | | | | | | | |
| 8 | 166/2.9 | 263/3.1 | 172/2.9 | 258/3.7 | 149/2.2 | 144/1.7 | 285/2.3 | 224/2.8 |
| 9 | | | | | | | | |
| 10 | | | | | | | | |
| 11 | 170/3.2 | 263/1.6 | 171/1.5 | 253/2.7 | 149/2.0 | — | 291/3.1 | — |
| 12 | | | | | | | | |
| 13 | | | | | | | | |
| 14 | 169/2.9 | 279/3.1 | 182/2.4 | 282/4.3 | 150/1.7 | 147/2.1 | 287/2.7 | 232/1.9 |
| Averages: | 167/2.7 | 267/2.8 | 173/4.2 | 265/5.3 | 150/2.2 | 146/1.8 | 288/2.8 | 227/2.7 |
| Stnd. Dev. Across Boat | 2.0 | 3.4 | 2.9 | 7.0 | 1.1 | 1.2 | 0.8 | 1.9 |
| Color on Si Slices | light tan | blue | tan-brown | brown | brown-blue | brown | brown-blue | |

TABLE 4-continued

| | Sheet Resistivity, ($\Omega/\square$)/Std Deviation, Percent | | | | | | | |
|---|---|---|---|---|---|---|---|---|
| | Run 1 | 2 | 3 | 4 | 5 | 6 | 7 | 8 |
| Estimated Thickness A | 200 | 800 | 400 | 500 | 700 | 500 | 700 | |
| Gas/liters per hr. | | | | | | | | |
| step (d) | $N_2$/1 | $N_2$/1 | Ar/1 | Ar/1 | He/1 | He/0.5 | He/1 | He/1 |
| step (e) | $N_2$/1 | $N_2$/1 | Ar/1 | Ar/1 | He/1 | He/0.5 | He/1 | He/1 |
| step (f) | — | $O_2$/1 | — | $O_2$/1 | — | — | $O_2$/1 | — |

Note from Table 4 that a heavier boron glassy film was deposited on the silicon wafers when the deposition was made in a helium atmosphere. Note also that the sheet resistivity after oxidation was more uniform if the deposition had been made in helium. Several advantages of the present invention over prior art processes for depositing large amounts of boron oxide are apparent. Thus, the present technique does not involve the formation of water vapor in the diffusion tube. The well-known process employing boron nitride as the source of boron, using the "hydrogen injection" technique results in the formation of water vapor. This is a very great advantage since the presence of water vapor tends to promote defects in silicon, and causes the boron to rapidly diffuse through the field oxide on the silicon surface.

Furthermore, the present method permits the deposition of the boron to be immediately followed with oxygen treatment. The oxygen oxidizes the boron-silicon phase on the silicon surface which contains many of the surface defects. It also raises its sheet resistivity even farther. When the so-called hydrogen injection process is used with boron nitride sources, the silicon wafers have to be removed from the boat and then reinserted in the diffusion furnace before oxidation treatment of the silicon wafers, since oxygen would have a detrimental effect on the boron nitride sources. Such removal of the silicon wafers from the boat in the furnace is very time-consuming. And, as already stated, boron can be deposited on the silicon at much lower temperatures using helium as the transport gas instead of nitrogen or argon, or, of course shorter times at the high temperatures can be used.

As will be evident to those skilled in the art, various modifications of this invention can be made or followed in the light of the foregoing disclosure and discussion without departing from the spirit and scope of the disclosure or from the scope of the claims.

I claim:

1. A method of diffusing $B_2O_3$ from the surface of a glass-ceramic consisting essentially of the following:

| Component | Mole Percent |
|---|---|
| $SiO_2$ | 15–60 |
| $Al_2O_3$ | 10–30 |
| $B_2O_3$ | 20–60 |
| RO | 3–25 |
| BaO | 0–15 | wherein $Al_2O_3/RO = 1.5-4$
wherein RO is selected from BaO, MgO, CaO, SrO and mixtures thereof; and
when $SiO_2$ is over 40, $B_2O_3$ is not over 40, RO is not over 20, and BaO is at least 1;
when $SiO_2$ is not over 40, $Al_2O_3$ is at least 15, RO is at least 5, MgO is not over 15, CaO is not over 10, SrO is not over 10, BaO is not over 15, $La_2O_3$ is 0–5, $Nb_2O_3$ is 0–5 and $Ta_2O_3$ is 0–5,
which comprises heating said glass-ceramic to a temperature of 700°–1200° C. while flushing the surface thereof with an inert transport or carrier gas comprising at least 60 mol percent helium.

2. In a process for doping a semiconductor wherein a semiconductor and a glass-ceramic dopant host for vapor phase transport of $B_2O_3$ are maintained in vapor phase communication in the presence of a carrier gas at a temperature and for a time sufficient to effect transport and deposit of $B_2O_3$ on said semiconductor, and wherein the glass-ceramic dopant host consists essentially of the following:

| Component | Mole Percent |
|---|---|
| $SiO_2$ | 15–60 |
| $Al_2O_3$ | 10–30 |
| $B_2O_3$ | 20–60 |
| RO | 3–25 |
| BaO | 0–15 | wherein $Al_2O_3/RO = 1.5-4$,
wherein RO is selected from BaO, MgO, CaO, SrO and mixtures thereof; and
when $SiO_2$ is over 40, $B_2O_3$ is not over 40, RO is not over 20, and BaO is at least 1;
when $SiO_2$ is not over 40, $Al_2O_3$ is at least 15, RO is at least 5, MgO is not over 15, CaO is not over 10, SrO is not over 10, BaO is not over 15, $La_2O_3$ is 0–5, $Nb_2O_3$ is 0–5 and $Ta_2O_3$ is 0–5,
the improvement which comprises employing helium as the carrier gas.

3. The improvement of claim 2 wherein the temperature is in the range of about 700° to about 1200° C.

4. The improvement of claim 2 wherein the temperature is in the range from about 700° to about 1050° C.

* * * * *